United States Patent

Moulding

[15] 3,697,784

[45] Oct. 10, 1972

[54] SEMICONDUCTOR INTEGRATED CIRCUITS

[72] Inventor: Kenneth William Moulding, Horley, England

[73] Assignee: U.S. Philips Corporation

[22] Filed: Feb. 4, 1971

[21] Appl. No.: 112,623

[30] Foreign Application Priority Data

Feb. 6, 1970 Great Britain............5,808/70

[52] U.S. Cl...................307/303, 317/235 R, 330/15

[51] Int. Cl................................................H01l 19/00

[58] Field of Search...........317/235, 22, 22.1, 237, 9; 307/303, 213; 328/165; 330/15, 38 M; 331/108 C

[56] References Cited

UNITED STATES PATENTS

| | | | |
|---|---|---|---|
| 3,421,026 | 1/1969 | Stopper | 317/235 |
| 3,497,821 | 2/1970 | Rongen et al. | 330/15 |
| 3,560,866 | 2/1971 | Haines | 330/38 M |

*Primary Examiner*—Jerry D. Craig
*Attorney*—Frank R. Trifari

[57] ABSTRACT

An integrated circuit eliminates the feedback effect of spurious signals between a push-pull transistor pair in separate islands and a third transistor in a third island by locating the third transistor island at a null point of the electric field pattern in the substrate corresponding to a spurious signal originating from the push-pull transistors.

10 Claims, 6 Drawing Figures

*INVENTOR.*
KENNETH W. MOULDING

*BY* Frank R. [signature]
AGENT

INVENTOR.
KENNETH W. MOULDING

BY

AGENT

SEMICONDUCTOR INTEGRATED CIRCUITS

This invention relates to semiconductor integrated circuits.

In one commonly known form of a semiconductor integrated circuit, a plurality of islands of material of one conductivity type, usually n-type, are present in an epitaxial layer of such material situated on a high resistivity substrate of opposite conductivity type (p-type) material. The islands are defined in the epitaxial layer by low resistivity regions of the same conductivity type material as the substrate, these regions extending through the epitaxial layer from the surface thereof to the substrate. The regions are formed by diffusion and are normally referred to as isolation walls. Semiconductor circuit elements are present in the islands and are formed by impurity diffusion into the surface portions of the islands through openings in a protective insulating masking layer on the epitaxial layer surface.

Interconnection of the various circuit elements present in the islands is achieved by metal layer parts which make contact with surface portions of the various circuit elements and further extend over the protective insulating layer. Electrical isolation between individual circuit elements in different islands is achieved by reverse-biasing the p-n junctions between the islands (n-type) and the substrate and isolation walls (p-types).

When a circuit element is a bipolar transistor, for example an n–p–n transistor having diffused emitter and base regions, the original material of an n-type island in an n-type epitaxial layer forms the collector region of the transistor. A capacitor or diode can be formed in an integrated circuit as a p-n junction capacitor or diode as an island of material of one conductivity type (e.g. n-type) and a region of opposite conductivity type (p-type) formed in the island.

In the design and development of circuit arrangements realized as semiconductor integrated circuits of the above form, it has been found that spurious signals causing unwanted feedback effects can pass from a transistor formed in one island to a transistor formed in another island over a path consisting of the collector region-to-substrate capacitance of each transistor and the bulk conduction of the substrate. Such a stray coupling path giving rise to spurious signals has been found to be particularly prevalent in an integrated circuit of a high gain/high frequency transistor amplifier. It has also been realized that spurious signals causing unwanted feedback effects could pass in the same fashion between any circuit elements (i.e. not necessarily transistors) which are in different islands and have a region forming a p–n junction with the substrate.

It is an object of the present invention to provide a way of substantially eliminating the feedback effect of such spurious signals in the integrated circuit realization of certain types of circuit arrangement.

According to a first aspect of the present invention there is provided a semiconductor integrated circuit comprising three islands bounded by isolation walls and each having a circuit element formed therein with a region forming a p–n junction with the substrate of the integrated circuit, wherein two of said circuit elements, one in each of tow of said islands, are connected as a push-pull pair two the remaining island is so positioned in the integrated circuit that said circuit element formed therein has said region thereof located at a null point of an electric potential pattern which can occur in the substrate as a result of spurious signals passing from each circuit element of the push-pull pair to the circuit element in said remaining island over paths consisting of the region-to-substrate capacitance of these circuit elements and the bulk conduction of the substrate.

In the operation of such an arrangement of a semiconductor integrated circuit according to this first aspect, voltages at said regions of the push-pull connected circuit elements will be in phase opposition so that spurious signals passing from these regions the to said region which is located at a null point will cancel at the null point with result that the feedback effect of the spurious signals is eliminated at the circuit element in said remaining island.

In carrying out the invention according to this first aspect at least one other island having a circuit element formed therein with a region forming p–n junction with the substrate of the integrated circuit can be so positioned in the integrated circuit that its circuit element has said region thereof located at a null point of said electric potential pattern so that the feedback effect of said spurious signals is eliminated at the circuit element in this other island also.

According to a second aspect of the present invention, which can be considered to be the dual of the first aspect, the feedback effect of spurious signals passing from the circuit element in one of said three islands to the two circuit elements in the other two of said islands, respectively, can be eliminated by connecting said two circuit elements as a push-pull pair and so positioning their islands inn the integrated circuit that said regions of these two circuit elements are located at points of corresponding potential of the electric potential pattern which can occur in the substrate as a result of said spurious signals. In this instance, the feedback effect of the spurious signals is eliminated because they produce equal voltages at antiphase connections of the push-pull pair which are in phase opposition so that these voltages cancel.

In carrying out the invention according to this second aspect, at least one other push-pull connected pair of circuit elements formed in respective islands, with a region thereof forming a p-n junction with the substrate of the integrated circuit, can have their said regions similarly located so as to eliminate the feedback effect of said spurious signals at these circuit elements also.

It is convenient or advantageous in some instances to provide for a particular application a transistor amplifier having a push-pull output stage. It would also be possible in some instances to provide the input or an intermiedate stage of an amplifier as a push-pull stage. In each of these instances, as is well known, voltages which are of equal magnitude but which are in phase opposition will be present at the collectors of the push-pull transistors during operation of the amplifier. It is also possible that two circuit elements of another type, e.g. capacitors, of a circuit arrangement can be connected as a push-pull pair; i.e., they will have voltages of equal magnitude but opposite phase present at one electrode of each during operation of the arrangement.

Thus, the present invention will have a general application in the realization as integrated circuits of circuit arrangements including a push-pull pair of circuit elements, in instances where the feedback effect of spurious signals, occurring as aforesaid, is to be eliminated. A particular application of the invention would be in the integrated circuit realization of a high frequency/high gain transistor amplifier which has been designed specifically with a push-pull output stage.

In carrying the invention into effect according to the first aspect it is to be appreciated that the electric potential pattern will depend upon the positioning of the two islands in which two transistors or other circuit elements comprising the push-pull pair are formed and also upon the shape of the complete isolation diffusion pattern of the integrated circuit. By providing a symmetrical layout in these two respects, null points can be made to lie along the center axis of the integrated circuit. It may not also be possible to achieve symmetry in the above two respects in which case null points will not lie along the center axis of the integrated circuit, but their positions can be found by the solution to La Place's equation ($\nabla^2\phi = 0$, where $\phi$ is the electric potential). This can be done either by using an electrolytic tank analogue or by relaxation methods on a digital computer.

In carrying the invention into effect according to the second aspect it will be apparent that similar considerations apply except that in this case it is points of corresponding potential (not null points) of the electric potential pattern which have to be determined.

The realization of a high gain/high frequency multistage transistor amplifier as an integrated circuit according to the invention can involve the use of a push-pull output stage having potential transistors formed in respective islands of the integrated circuit, with the transistor or transistors of one or more preceding stages, preferably at least the input stage, formed in another island which is/are located, as aforesaid, at a null point or points of the electric potential pattern in the substrate of the integrated circuit. Alternatively, the input stage and/or at least one intermediate stage of the amplifier may be comprised by a push-pull transistor pair having its two transistors formed in respective islands which are located at points of corresponding potential of the electrical potential pattern in the substrate due to the output stage of the amplifier which is formed in another island.

The invention can also be applied for eliminating the feedback effect of spurious signals between transistors or other circuit elements of different types of circuit arrangement which are formed in the same integrated circuit.

In order that the invention may be more fully understood reference will now be made by way of example to the accompanying drawings of which:

Figure 1:
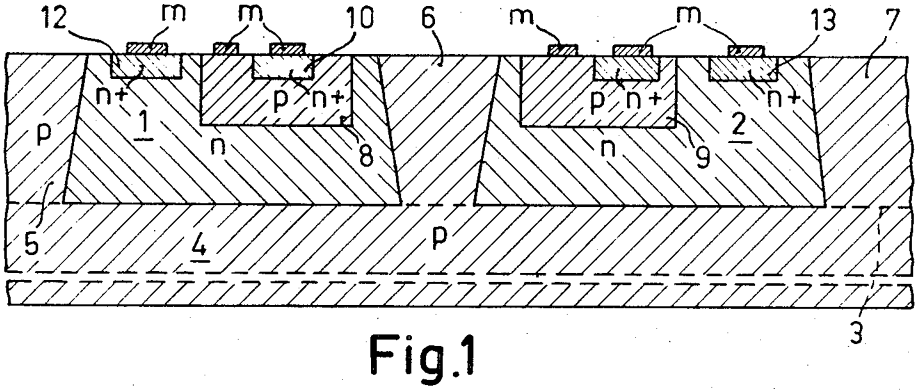
FIG. 1 shows in cross-section an integrated circuit having two transistors formed therein.

Referring to the drawings, the semiconductor integrated circuit shown in FIG. 1 comprises two islands 1 and 2 of n-type conductivity material which are present in an eptaxial n-type layer 3 situated on a high resistivity substrate 4 of p-type conductivity material. The islands 1 and 2 are defined in the epitaxial layer 3 by low resistivity regions 5, 6 and 7 of p-type conductivity material which extend through the epitaxial layer 3 from the surface thereof to the substrate. The regions 5, 6 and 7 are formed by diffusion and are normally referred to as isolation walls. In each of the islands 1 and 2 there is formed a bipolar transistor by impurity diffusion into the surface portions of the islands 1 and 2 through openings in a protective insulating masking layer (not shown) on the surface of the epitaxial layer 3. In each of the islands 1 and 2 the n-type material is the collector of the transistor, the base of the transistor is a region 8 (or 9) of p-type material formed within the island, and the emitter of the transistor is an *n*+ region 10 (or 11) of more highly conducting n-type material within the base region 8 (or 9). An *n*+ region 12 (or 13) of more highly conducting n-type material affords connection to the collector region 1 (or 2).

Connection to the two transistors and interconnections between them would be achieved by metal layer parts *m* which make contact with the surface portions of the transistors.

Figure 2:
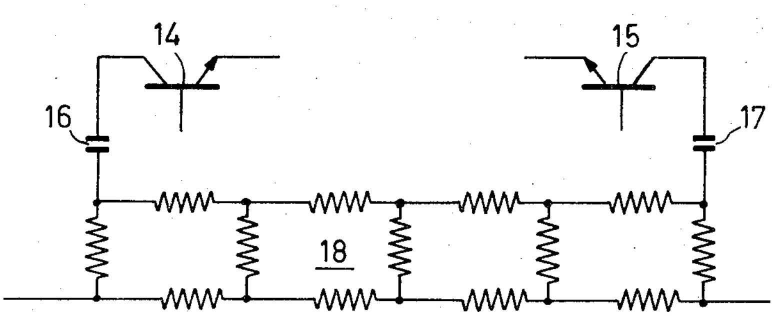
FIG. 2 shows diagrammatically the feedback path between the collector regions of the two transistors in the integrated circuit of FIG. 1.

Electrical isolation between the two transistors in the two islands is achieved by reverse biasing the p-n junctions between the n-type islands 1 and 2 and the p-type substrate 4 and isolation walls 5, 6 and 7. However, a serious potential source of feedback exists along a path through the substrate 4 via the collector region-to-substrate capacitances of the two transistors. This feedback path is shown diagrammatically in FIG. 2, in which the two transistors are represented at 14 and 15, their collector region-to-substrate capacitances are represented at 16 and 17, and the bulk conduction of the substrate 4 is represented by the resistance network 18.

Figure 3:
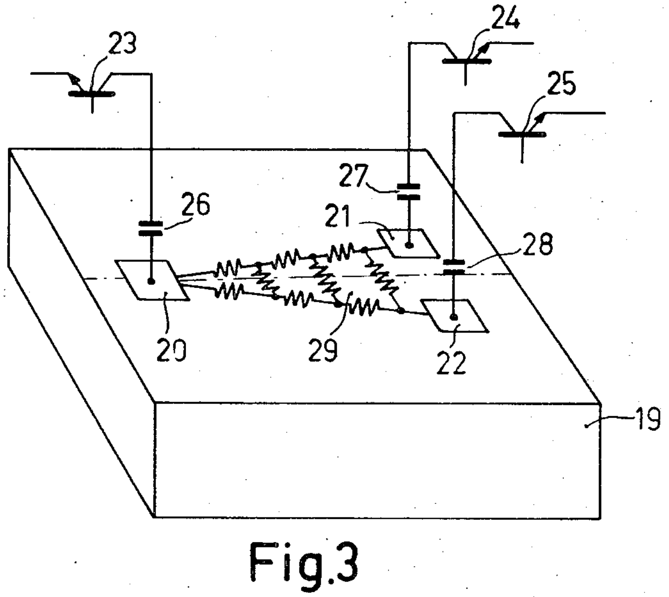
FIG. 3 shows diagrammatically the location of islands in an integrated circuit according to the invention.
Figure 4:
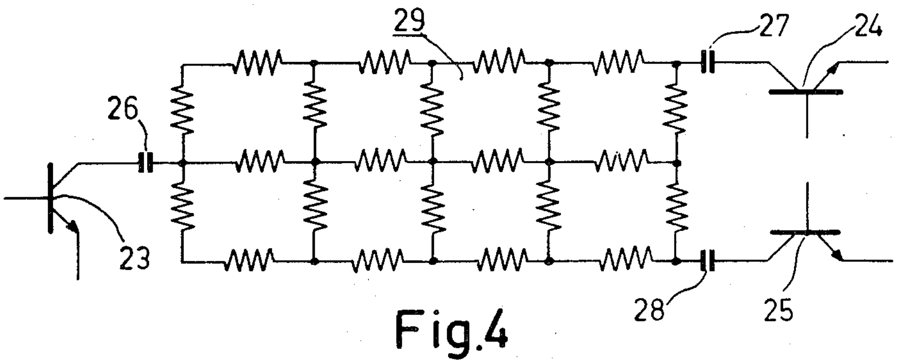
FIG. 4 shows diagrammatically the feedback path between the collector regions of the transistors in the circuit of FIG. 3.

If one of the two transistors is replaced by two transistors which are located in separate islands, then there will be a feedback path between the collector of each of these two transistors and the collector of the other transistor. This is illustrated diagrammatically in FIG. 3 which shows a substrate 19 having islands 20, 21 and 22, with transistors 23, 24 and 25 assumed to be formed in these islands, respectively. The collector region-to-substrate capacitances of the transistors are represented by capacitors 26, 27 and 28, and the resistance paths afforded by bulk conduction of the substrate 19 are represented by the resistance network 29. FIG. 4 shows diagrammatically the symmetry of the resistance network 29 which is achieved when the island 20 is positioned symmetrically with respect to the islands 21 and 22 on the center axis of the integrated circuit. Connection of the two transistors 24 and 25 in push-push will result in their collector voltages being in anti-phase so that any feedback voltages appearing at the collector of transistor 23 from the collectors of transistors 24 and 25 over the feedback paths will be of corresponding magnitude but in anti-phase and will thus cancel each other at the collector of transistor 23.

It is assumed that with such symmetry the null points of electrical potential due to the feedback voltages will lie along the center axis of the integrated circuit. La Place's equation can be used, as aforesaid, to find points of zero potential for positioning the transistor, from which it is required to eliminate the effects of the feedback voltages, in cases where it is not possible to achieve a symmetrical layout.

Figure 5:
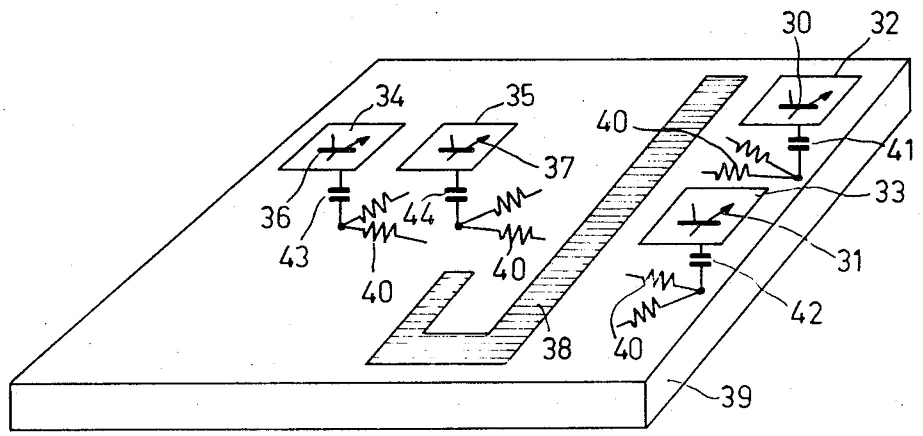
FIG. 5 shows diagrammatically, the location of islands in another integrated circuit according to the invention.
Figure 6:
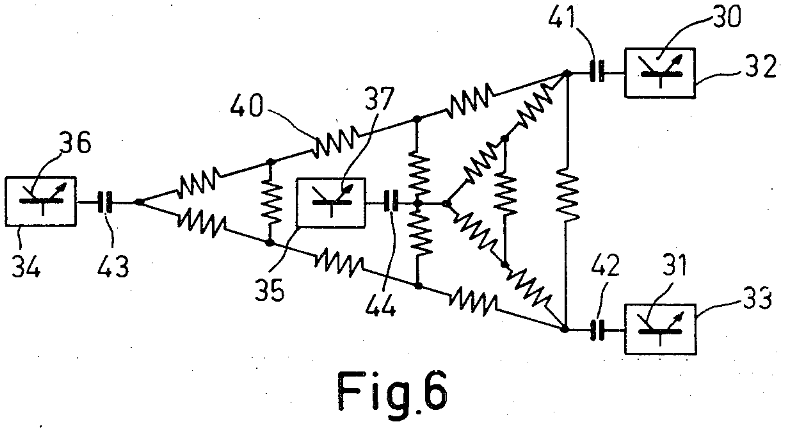
FIG. 6 shows diagrammatically, the feedback paths between the collector regions of the transistors in the circuit of FIG. 5.

FIGS. 5 and 6 illustrate the application of the invention for eliminating the effects of the feedback voltages from one transistor stage to two or more other transistors or transistor stages in respective islands of an integrated circuit. In FIGS. 5, the said one transistor stage is provided as a push-pull stage comprising two transistors 30 and 31 in respective islands 32 and 33, and each of the two or more other islands 34 and 35 comprise respective transistor stages as represented by transistors 36 and 37 therein. The region 38 represents a hypothetical isolation diffusion pattern in substrate 39 of the integrated circuit. Resistances 40 represent the bulk conduction of the substrate 39, and capacitances 41 to 44 represent the respective collector region-to-substrate capacitances of the transistors 30, 31, 36 and 37. By positioning each of the islands 34 and 35 at a null point of the electric potential pattern which can occur in the substrate 39 as a result of spurious signals passing from the collector of each of the push-pull transistors 30 and 31, a symmetrical feedback arrangement as shown in FIG. 6 is obtained. Thus, the feedback effect of the spurious signals is eliminated at each of the islands 34 and 35.

Although the foregoing description given with reference to the drawings deals only with the first aspect of the invention, it will be apparent that the description is equally applicable to the second aspect of the invention, except that in the latter case the requirements of symmetry will be in regard to points of corresponding potential in the electric potential pattern and not to null points.

What we claim is:

1. A semiconductor integrated circuit comprising a common semiconductor substrate, at least three circuit elements in said substrate, isolation means bounding each of said circuit elements, means connecting two of said circuit elements as a push-pull pair, and means to couple the third of said circuit elements to said push-pull pair whereby said push-pull pair is an output stage for said third circuit element, spurious signals passing from said two circuit elements in said push-pull pair over a path including region-to-substrate capacitance of said two circuit elements and the bulk conduction of said substrate establishing in said substrate an electric potential pattern including at least one null point, said third circuit element being located at a null of the electric potential pattern in order to substantially eliminate in the substrate any undesired feedback effects of the spurious signals.

2. A semiconductor integrated circuit as claimed in claim 1, wherein said circuit elements are transistors, each of said transistors being formed in an island.

3. A semiconductor integrated circuit as claimed in claim 1, wherein said third circuit element is symmetrically located with respect to said first and second circuit elements.

4. A semiconductor integrated circuit comprising a common semiconductor substrate, at least three circuit elements in said substrate, isolation means bounding each of said circuit elements, means connecting two of said circuit elements as a push-pull pair, and means to couple said push-pull pair to the third of said circuit element whereby said circuit elements is an output stage for said push-pull pair, spurious signals passing from said third circuit element to said two circuit elements over paths including region-to-substrate capacitance of said two circuit elements and the bulk conduction of said substrate establishing in said substrate an electric potential pattern including two equipotential points, each of said two circuit elements being located at two equipotential points respectively in order to eliminate substantially in said substate any undesired feedback effects of the spurious signals.

5. A semiconductor integrated circuit as claimed in claim 4, wherein said circuit element are transistors, each of said transistors being formed in an island.

6. A semiconductor integrated circuit as claimed in claim 4, wherein said third circuit element is symmetrically located with respect to said first and second circuit elements.

7. A semiconductor integrated circuit as claimed in claim 3, wherein the semiconductor body comprises a fourth island, a fourth transistor being provided in said fourth island, said fourth island being located symmetrically with respect to the first and second islands.

8. A semiconductor integrated circuit as claimed in claim 7, wherein the transistor of said third and fourth islands are connected in push-pull and form an input stage for the push-pull pair formed by the transistors of said first and second islands.

9. A semiconductor integrated circuit as claimed in claim 6, wherein the semiconductor body comprises a fourth island, a fourth island being located symmetrically with respect to the first and second islands.

10. A semiconductor integrated circuit as claimed in claim 9, wherein the transistor of said third and fourth islands are connected in push-pull and form an input stage for the push-pull pair formed by the transistors of said first and second islands.

* * * * *